(12) United States Patent
Chiang et al.

(10) Patent No.: US 9,232,659 B2
(45) Date of Patent: Jan. 5, 2016

(54) HOUSING AND METHOD FOR MAKING SAME

(71) Applicant: FIH (Hong Kong) Limited, Kowloon (HK)

(72) Inventors: Chwan-Hwa Chiang, New Taipei (TW); Chieh-Hsiang Wang, New Taipei (TW)

(73) Assignee: FIH (Hong Kong) Limited, Kowloon (HK)

( * ) Notice: Subject to any disclaimer, the term of this patent is extended or adjusted under 35 U.S.C. 154(b) by 207 days.

(21) Appl. No.: 14/098,685

(22) Filed: Dec. 6, 2013

(65) Prior Publication Data

US 2015/0003028 A1 Jan. 1, 2015

(30) Foreign Application Priority Data

Jun. 28, 2013 (CN) .......................... 2013 1 0263976

(51) Int. Cl.
| | |
|---|---|
| *H05K 3/00* | (2006.01) |
| *H05K 1/02* | (2006.01) |
| *H05K 1/16* | (2006.01) |
| *H05K 3/46* | (2006.01) |
| *H04M 1/02* | (2006.01) |

(52) U.S. Cl.
CPC ............ *H05K 3/0014* (2013.01); *H05K 1/0284* (2013.01); *H05K 1/162* (2013.01); *H05K 3/4629* (2013.01); *H04M 1/0202* (2013.01); *H04M 1/0262* (2013.01); *H04M 1/0277* (2013.01); *H05K 2201/09018* (2013.01); *H05K 2201/0999* (2013.01)

(58) Field of Classification Search
CPC ... H05K 3/0014; H05K 1/162; H05K 3/4629; H05K 1/0284; H05K 2201/09018; H05K 2201/0999; H04M 1/0202; H04M 1/0262; H04M 1/0277

See application file for complete search history.

(56) References Cited

U.S. PATENT DOCUMENTS

| | | | | |
|---|---|---|---|---|
| 4,788,626 | A * | 11/1988 | Neidig et al. ................. | 361/715 |
| 5,089,455 | A * | 2/1992 | Ketcham et al. .............. | 501/104 |
| 5,163,209 | A * | 11/1992 | Harada et al. ................. | 29/25.35 |
| 5,814,262 | A * | 9/1998 | Ketcham et al. .............. | 264/316 |
| 6,442,041 | B2 * | 8/2002 | Rehm et al. .................... | 361/760 |
| 6,605,779 | B2 * | 8/2003 | Takata et al. .................. | 174/559 |
| 6,927,533 | B1 * | 8/2005 | Ito et al. ........................ | 313/495 |
| 7,623,078 | B2 * | 11/2009 | Wang ............................. | 343/702 |
| 8,802,998 | B2 * | 8/2014 | Okada et al. .................. | 174/257 |
| 2003/0077504 | A1 * | 4/2003 | Hara et al. ...................... | 429/44 |
| 2003/0090007 | A1 * | 5/2003 | Fischbach et al. ............. | 257/789 |
| 2003/0146691 | A1 * | 8/2003 | Yano et al. ..................... | 313/503 |
| 2003/0222942 | A1 * | 12/2003 | Kitagawa et al. ............... | 347/68 |
| 2006/0171127 | A1 * | 8/2006 | Kadoya et al. ................. | 361/752 |
| 2006/0183625 | A1 * | 8/2006 | Miyahara ...................... | 501/98.4 |
| 2006/0260840 | A1 * | 11/2006 | Kim ............................... | 174/377 |
| 2007/0003781 | A1 * | 1/2007 | de Rochemont .............. | 428/615 |
| 2007/0249770 | A1 * | 10/2007 | Fukui et al. .................... | 524/394 |
| 2008/0075984 | A1 * | 3/2008 | Badding et al. ................. | 429/12 |
| 2009/0244812 | A1 * | 10/2009 | Rawal et al. ................... | 361/525 |

(Continued)

*Primary Examiner* — David M Sinclair
*Assistant Examiner* — Theron Milliser
(74) *Attorney, Agent, or Firm* — Novak Druce Connolly Bove + Quigg LLP

(57) ABSTRACT

A housing for an electronic device includes a ceramic base comprising ceramic material, at least one electronic element embedded in the ceramic base, and a buffer layer made of resin. The ceramic base includes an inner surface. The buffer layer is formed on the inner surface. A method for making the housing is also provided.

11 Claims, 3 Drawing Sheets

(56) References Cited

U.S. PATENT DOCUMENTS

| | | | |
|---|---|---|---|
| 2009/0258234 A1* | 10/2009 | Chiang et al. | 428/412 |
| 2010/0101701 A1* | 4/2010 | Cho et al. | 156/89.12 |
| 2010/0103612 A1* | 4/2010 | Weber et al. | 361/679.56 |
| 2010/0104786 A1* | 4/2010 | Chiang et al. | 428/35.7 |
| 2010/0147573 A1* | 6/2010 | Fukuda | 174/260 |
| 2010/0246146 A1* | 9/2010 | Sugimoto et al. | 361/757 |
| 2011/0120743 A1* | 5/2011 | Liu et al. | 174/50 |
| 2011/0183091 A1* | 7/2011 | Zhu et al. | 428/34.6 |
| 2011/0269413 A1* | 11/2011 | Park et al. | 455/90.2 |
| 2011/0310530 A1* | 12/2011 | Laor | 361/524 |
| 2012/0040136 A1* | 2/2012 | Du et al. | 428/142 |
| 2012/0146467 A1* | 6/2012 | Zhu et al. | 312/223.1 |
| 2012/0212890 A1* | 8/2012 | Hoshino et al. | 361/679.01 |
| 2014/0085163 A1* | 3/2014 | Gregg | 343/872 |

* cited by examiner

HOUSING AND METHOD FOR MAKING SAME

BACKGROUND

1. Technical Field

The present disclosure relates to a housing for an electronic device and a method for making the housing.

2. Description of Related Art

Housings of portable electronic devices are usually made of plastic or metal. Although plastic housings can be formed easily by injection molding, they are not very strong and not very resistant to abrasion. Although metal housings are stronger and have greater abrasion resistance, they are electrically conductive, which may cause them to interfere with communication signals.

Therefore, there is room for improvement within the art.

BRIEF DESCRIPTION OF THE DRAWINGS

Many aspects of the disclosure can be better understood with reference to the drawing. The components in the drawing are not necessarily drawn to scale, the emphasis instead being placed upon clearly illustrating the principles of the disclosure. Moreover, in the drawings like reference numerals designate corresponding parts throughout the views.

DETAILED DESCRIPTION

Figure 1:
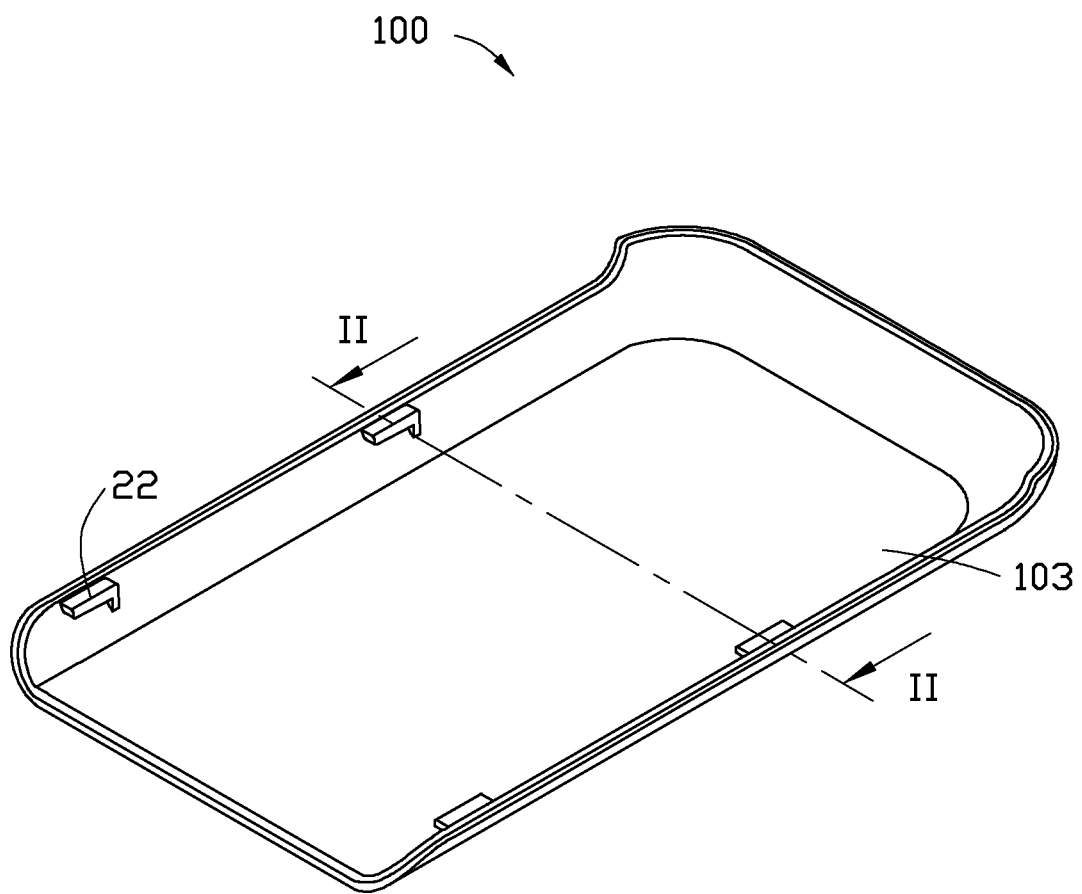
FIG. 1 is an isometric view of an embodiment of a housing.
Figure 2:
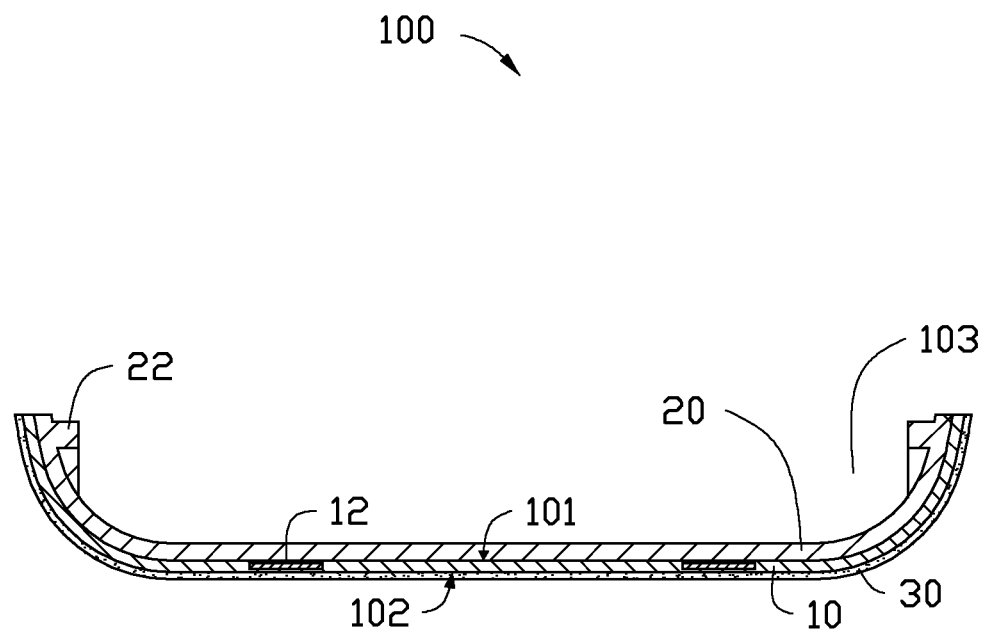
FIG. 2 is a cross-sectional view of the housing taken along line II-II of FIG. 1.

FIG. 1 and FIG. 2 show an embodiment of a housing 100 of an electronic device, such as a mobile phone or a tablet computer. The housing 100 includes a ceramic base 10 and a buffer layer 20 directly bonded to an inner surface of the ceramic base 10.

The ceramic base 10 is formed by laminating a plurality of ceramic green sheets and sintering the laminated ceramic green sheets. The ceramic base 10 mainly consists of ceramic material. The ceramic material can be, but is not limited to being, a mixture of zirconium dioxide ($ZrO_2$), iridium trioxide ($In_2O_3$), and aluminum oxide ($Al_2O_3$), wherein the $ZrO_2$ has a weight percentage of about 85% to about 91%, the $In_2O_3$ has a weight percentage of about 8% to about 13%, and the $Al_2O_3$ has weight percentage of about 1% to about 2%. In other embodiments, the ceramic material can be dielectric ceramic material. The dielectric material can comprise, but is not limited to comprising, barium titanate ($BaTiO_3$) or zinc-magnesium titanate ($(Zn,Mg)TiO_3$) as a main constituent. In the dielectric ceramic material comprising $BaTiO_3$ as the main constituent, the $BaTiO_3$ has a weight percentage of about 63% to about 69%. The ceramic base 10 can further contain a sintering-assistant agent for decreasing a required sintering temperature of the ceramic material. The sintering-assistant agent can be an oxide having a melting point lower than a sintering temperature of the ceramic material. The oxide can be, but is not limited to being, copper oxide, zinc oxide, boron trioxide ($B_2O_3$), $ZnO$—$B_2O_3$ system glass, or any combination thereof. In the embodiment, the sintering-assistant agent is $ZnO$—$B_2O_3$ system glass. The ceramic base 10 can have a thickness of about 0.06 millimeters (mm) to about 2.0 mm. The ceramic base 10 has an inner surface 101 and an opposite outer surface 102. The ceramic base 10 defines a receiving area 103. The inner surface 101 faces the receiving area 103.

At least one electronic element 12 is embedded in the ceramic base 10. The at least one electronic element 12 can be, but is not limited to being, an antenna, an internal electrode of a capacitor, a printed circuit board, or any combination thereof. The at least one electronic element 12 can be made of, but is not limited to being made of, silver, alloy of silver and palladium, or palladium. When the electronic element 12 is an internal electrode of a capacitor, a portion of or an entire of the ceramic base 10 and the electronic element 12 can constitute the capacitor. The capacitor can be connected to a circuit board of an electronic device employing the housing 100 and be connected in parallel to a battery of the electronic device, thereby preventing the electronic device from turning off when the battery is close to running out of power. When the electronic element 12 is a printed circuit board, the electronic element 12 can be a hidden-type main board of the electronic device, thereby facilitating miniaturization of the electronic device and improvement of heat dispersion of the electronic device.

When a portion of or an entire of the ceramic base 10 and the electronic element 12 constitute a capacitor, the ceramic material of the ceramic base 10 is dielectric ceramic material to meet a dielectric requirement of the capacitor. When the electronic element 12 is made of an alloy of silver and palladium, the melting point of the electronic element 12 can be increased by adjusting a content ratio between the silver and the palladium. In this situation, the ceramic base 10 does not need the sintering-assistant agent.

The buffer layer 20 is made of resin and is integrally molded with the ceramic base 10. The buffer layer 20 can contact a portion of or an entire inner surface 101 of the ceramic base 10. The buffer layer 20 forms at least one assembling structure 22 for assembling the housing 100 to a main body of an electronic device. The assembling structure 22 can be, but is not limited to being, a clasp, a pin, or a post, or any combination thereof. The resin can be, but is not limited to being, polyvinylchloride, polyethylene terephthalate, acrylonitrile-butadiene-styrene copolymer, polycarbonate, polyimide, polyetherimide, polystyrene, and/or polypropylene.

The housing 100 can further include a decorative layer 30 formed on the outer surface 102 of the ceramic base 10. The decorative layer 30 can comprise, but is not limited to comprising, a glaze layer, a paint layer, and/or an ink layer.

Figure 3:
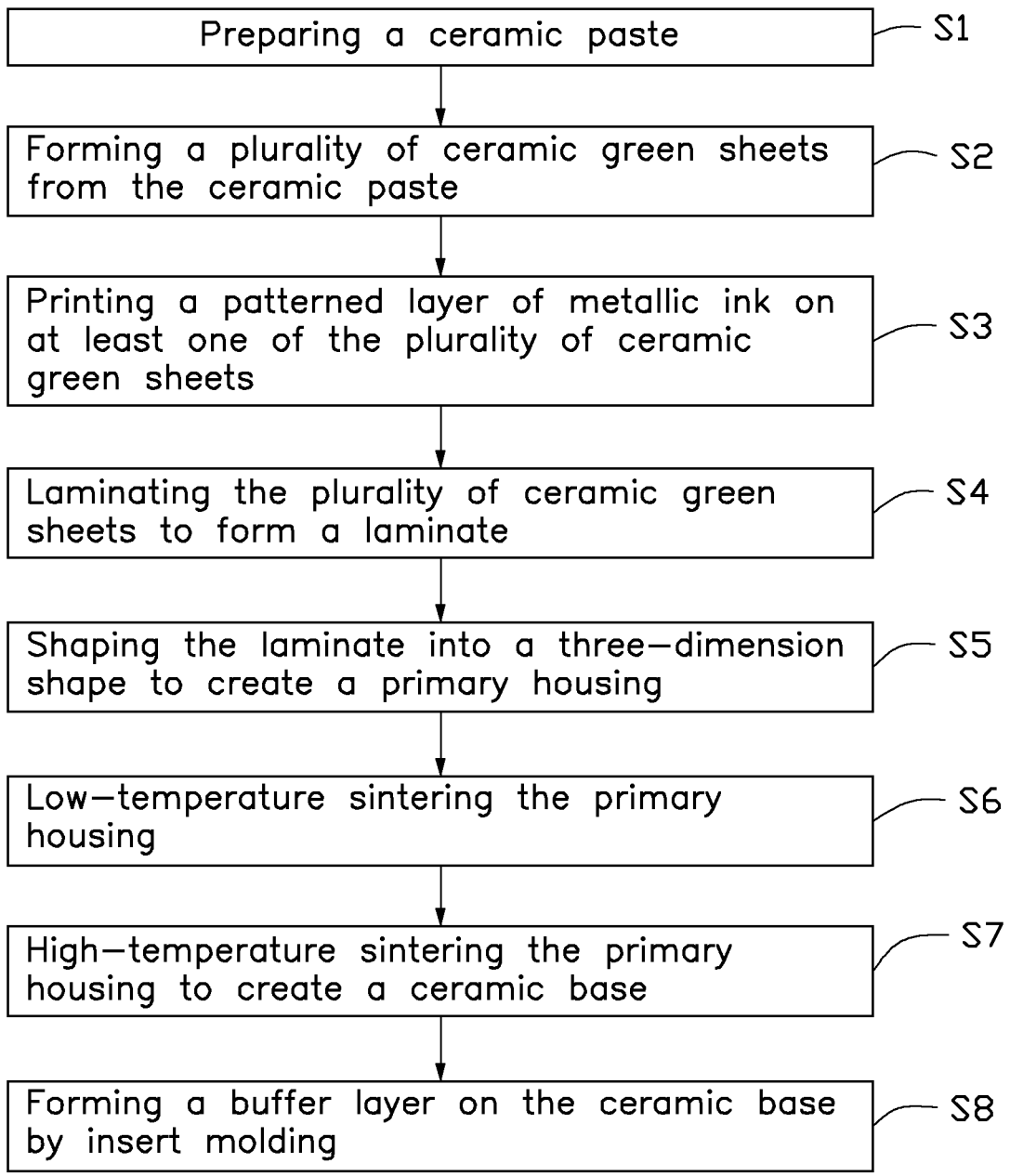
FIG. 3 is a flowchart of an embodiment of a process for making the housing of FIG. 1.

Referring to FIG. 3, a method for making the housing 100 can include the following steps.

Step S1: preparing a ceramic paste. The ceramic material in powder form, the sintering-assistant agent, an adhesive, and an organic solvent are mixed to form the ceramic paste. The adhesive can be, but is not limited to being, polyethylene glycol or polyvinyl butyral, or a combination thereof. A weight ratio of the ceramic material to the adhesive is in a range from about 6:4 to about 9:1. The sintering-assistant agent decreases a sintering temperature of the ceramic material to be lower than a melting point temperature of the electronic element 12, protecting the at least one electronic element 12 from damaged during a subsequent sintering process. In the exemplary embodiment, the sintering-assistant agent is $ZnO$—$B_2O_3$ system glass. The organic solvent assists in uniformly mixing the ceramic material with the sintering-assistant agent and the adhesive. The organic solvent can be, but is not limited to being, a mixture of isopropanol and xylene.

Step S2: forming a plurality of ceramic green sheets from the ceramic paste. Each ceramic green sheet is a sheet formed from the ceramic paste. A green tape caster or a scraper is used to form the plurality of ceramic green sheets from the ceramic paste. Each ceramic green sheet has a thickness of about 10 micrometers (μm) to about 30 μm.

Step S3: printing a patterned layer of metallic ink on at least one of the plurality of ceramic green sheets. The metallic ink contains metal powder and organic adhesive paste. The metal powder can be, but is not limited to being, silver, alloy of silver and palladium, or palladium.

Step S4: laminating the plurality of ceramic green sheets to form a laminate. The plurality of ceramic green sheets are laminated to form a laminate. At least one ceramic green sheet is stacked on the ceramic green sheet having the patterned layer of metallic ink, to cover and protect the patterned layer of metallic ink. The laminate can further be pressed by a hydraulic press to create a firm bond among the plurality of ceramic green sheets. A pressure of about 30 MPa to about 100 MPa can by applied to the laminate for about 5 minutes to about 15 minutes. The laminate can include 2-50 ceramic green sheets.

Step S5: shaping the laminate by high-pressure molding. The laminate is shaped into a desired three-dimensional shape by a heat-pressing mold, and unnecessary portions of the shaped laminate are removed to form a primary housing. During the high-pressure molding, a pressure of about 30 kg/cm$^2$ to about 70 kg/cm$^2$ is applied to the laminate for about 1 minute to about 2 minutes, and the heat-pressing mold is heated at a temperature of about 60° C. to about 200° C.

Step S6: low-temperature sintering the primary housing. The primary housing is heated to a temperature lower than the sintering temperature of the primary housing. Specifically, the primary housing is heated at an increasing temperature rate of about 100° C./hour until the primary housing is heated to about 600° C., and the primary housing is maintained at about 600° C. for about 6 hours. Then, the primary housing is naturally cooled to room temperature. The low-temperature sintering removes the adhesive and the organic solvent from the primary housing, thereby creating spaces in the primary housing. The metal powder in the primary housing forms the at least one electronic element 12.

Step S7: high-temperature sintering the primary housing to form the ceramic base 10. The primary housing is heated to the sintering temperature of the primary housing, thereby fusing the ceramic powder particles together and creating one solid piece having mechanical characteristics. Specifically, the primary housing treated by Step S6 is heated at an increasing temperature rate of about 6.5° C./hour until the primary housing reaches a temperature of about 700° C. Then, the primary housing is heated at an increasing temperature rate of about 0.3° C./hour to about 0.5° C./hour until the primary housing reaches the sintering temperature of the primary housing. The primary housing is maintained at the sintering temperature for about 2 hours. Ceramic crystals are formed during the high-temperature sintering process and fill in the spaces created in Step S6, thereby increasing a density of the ceramic material and improving physical properties.

When no sintering-assistant agent is added, the dielectric ceramic material comprising $BaTiO_3$ as a main constituent has a sintering temperature range from about 950° C. to about 1350° C., and the mixed ceramic material of $ZrO_2$, $In_2O_3$, and $Al_2O_3$ has a sintering temperature range from about 1350° C. to about 1750° C. By adding the sintering-assistant agent, the sintering temperature of both the dielectric ceramic material comprising $BaTiO_3$ as a main constituent and the mixed ceramic material of $ZrO_2$, $In_2O_3$, and $Al_2O_3$ is reduced to about 800° C. to about 1000° C. In the embodiment, the sintering temperature is about 950° C. During the high-temperature sintering process, the heating rate is reduced to about 0.3° C./hour to about 0.5° C./hour after the temperature reaches about 700° C., which slows down a fusing rate of the ceramic powder particles, thereby effectively preventing cracks on corner portions of the ceramic base 100.

Step S8: forming the buffer layer 20 on the inner surface 101 by insert molding. The ceramic base 10 is inserted into an injection mold. Molten resin is injected into the injection mold to bond with the inner surface 101, and then cooled to form the buffer layer 20. The buffer layer 20 forms the at least one assembling structure 22.

The method can further include a step of forming the decorative layer 30 on the outer surface 102 of the ceramic base 10 by paint-spraying or ink-printing, for example.

The ceramic base 10 has high abrasion resistance. The buffer layer 20 reduces shock to internal electronic elements of the electronic device using the housing 100. Furthermore, both the ceramic base 10 and the buffer layer 20 do not interfere with communication signals.

In other embodiments, the sintering-assistant agent can be omitted as long as the primary housing has a sintering temperature lower than the melting point of the metal powder for forming the at least one electronic element 12.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A housing for an electronic device, comprising: a ceramic base comprising ceramic material, the ceramic base defining a receiving area and comprising an inner surface facing the receiving area; at least one electronic element embedded in the ceramic base; and a buffer layer formed on and in contact with the inner surface, the buffer layer made of resin;
   wherein the ceramic material is a mixture of $ZrO_2$, $In_2O_3$, and $Al_2O_3$; in the mixture, the $ZrO_2$ has a weight percentage of about 85% to about 91%, the $In_2O_3$ has a weight percentage of about 8% to about 13%, and the $Al_2O_3$ has weight percentage of about 1% to about 2%.

2. The housing as claimed in claim 1, wherein the ceramic base further comprises a sintering-assistant agent; the sintering-assistant agent is an oxide having a melting point lower than a sintering temperature of the ceramic material.

3. The housing as claimed in claim 1, wherein the at least one electronic element is one or more selected from the group consisting of antenna, internal electrode of a capacitor, and printed circuit board.

4. The housing as claimed in claim 3, wherein the at least one electronic element is made of a material selected from the group consisting of silver, alloy of silver and palladium, and palladium.

5. The housing as claimed in claim 1, wherein the buffer layer forms at least one assembling structure.

6. The housing as claimed in claim 5, wherein the at least one assembling structure is one or more selected from the group consisting of a clasp, a pin, and a post.

7. A method for making a housing of an electronic device, comprising:
   preparing a ceramic paste by mixing ceramic powder, and adhesive, and an organic solvent;
   forming a plurality of ceramic green sheets from the ceramic paste;

printing a patterned layer of metallic ink on at least one of the plurality of ceramic green sheets, the metallic ink containing metal powder and organic adhesive paste;

laminating the plurality of ceramic green sheets to form a laminate, with at least one ceramic green sheet stacked on the ceramic green sheet having the patterned layer of metallic ink;

shaping the laminate by high-pressure molding and removing unnecessary portions of the shaped laminate to forming a primary housing;

heating the primary housing at a temperature lower than the sintering temperature of the primary housing, thereby removing the adhesive, the organic solvent, and the organic adhesive paste from the primary housing, the metal powder remained in the primary housing to form at least one electronic element;

heating the primary housing at the sintering temperature of the primary housing, thereby fusing the ceramic powder together and creating a ceramic base, the ceramic base defining a receiving area and having an inner surface facing the receiving area;

forming a buffer layer on and in contact with the inner surface by insert molding, the buffer layer made of resin wherein the ceramic powder is a mixture of $ZrO_2$, $In_7O_3$, and $Al_2O_3$; in the mixture, the $ZrO_2$ has a weight percentage of about 85% to about 91%, the $In_2O_3$ has a weight percentage of about 8% to about 13%, and the $Al_2O_3$ has weight percentage of about 1% to about 2%.

8. The method as claimed in claim 7, wherein the step of preparing the ceramic paste further includes adding a sintering-assistant agent in the ceramic paste, the sintering-assistant agent is an oxide having a melting point lower than a sintering temperature of the ceramic powder.

9. The method as claimed in claim 7, wherein during the step of heating the primary housing at a temperature lower than the sintering temperature of the primary housing, the primary housing is heated at an increasing temperature rate of about 100° C./hour until the primary housing is heated to about 600° C., and the primary housing is maintained at about 600° C. for about 6 hours, then the primary housing is naturally cooled to room temperature.

10. The method as claimed in claim 9, wherein during the step of heating the primary housing at the sintering temperature of the primary housing, the primary housing is heated at an increasing temperature rate of about 6.5° C./hour until the primary housing reaches a temperature of about 700° C., then the primary housing is heated at an increasing temperature rate of about 0.3° C./hour to about 0.5° C./hour until the primary housing reaches the sintering temperature of the primary housing, and the primary housing is maintained at the sintering temperature for about 2 hours.

11. The method as claimed in claim 7, wherein the metal powder is one selected from the group consisting of silver, alloy of silver and palladium, and palladium.

* * * * *